(12) United States Patent
Hooper et al.

(10) Patent No.: US 7,316,965 B2
(45) Date of Patent: Jan. 8, 2008

(54) SUBSTRATE CONTACT FOR A CAPPED MEMS AND METHOD OF MAKING THE SUBSTRATE CONTACT AT THE WAFER LEVEL

(75) Inventors: Stephen R. Hooper, Mesa, AZ (US); Hemant D. Desai, Gilbert, AZ (US); William G. McDonald, Scottsdale, AZ (US); Arvind S. Salian, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 241 days.

(21) Appl. No.: 11/158,793

(22) Filed: Jun. 21, 2005

(65) Prior Publication Data

US 2006/0286707 A1 Dec. 21, 2006

(51) Int. Cl.
*H01L 21/00* (2006.01)
(52) U.S. Cl. .............................. 438/460; 257/E21.238
(58) Field of Classification Search ................ 438/462, 438/460
See application file for complete search history.

(56) References Cited

U.S. PATENT DOCUMENTS 4,219,835 A * 8/1980 van Loon et al. ........... 257/330
6,271,060 B1 8/2001 Zandman et al.
6,790,709 B2 * 9/2004 Dias et al. .................. 438/122
2005/0067676 A1 3/2005 Mahadevan et al.

* cited by examiner

*Primary Examiner*—Scott B. Geyer
*Assistant Examiner*—Elias Ullah
(74) *Attorney, Agent, or Firm*—Ingrassia, Fisher & Lorenz, P.C.

(57) ABSTRACT

A MEMS device (100) is provided that includes a handle layer (108) having a sidewall (138), a cap (132) overlying said handle layer (108), said cap (132) having a sidewall (138), and a conductive material (136) disposed on at least a portion of said sidewall of said cap (138) and said sidewall of said handle layer (138) to thereby electrically couple said handle layer (108) to said cap (132). A wafer-level method for manufacturing the MEMS device from a substrate (300) comprising a handle layer (108) and a cap (132) overlying the handle layer (108) is also provided. The method includes making a first cut through the cap (132) and at least a portion of the substrate (300) to form a first sidewall (138), and depositing a conductive material (136) onto the first sidewall (138) to electrically couple the cap (132) to the substrate (300).

18 Claims, 3 Drawing Sheets

SUBSTRATE CONTACT FOR A CAPPED MEMS AND METHOD OF MAKING THE SUBSTRATE CONTACT AT THE WAFER LEVEL

FIELD OF THE INVENTION

The present invention generally relates to micro-electromechanical systems ("MEMS"), and more particularly relates to establishing contacts for use on MEMS.

BACKGROUND OF THE INVENTION

Many devices and systems include a number of different types of sensors that perform various monitoring and/or control functions. Advancements in micromachining and other microfabrication processes have enabled the manufacturing of a wide variety of microelectromechanical systems ("MEMS") devices. In recent years, many of the sensors that are used to perform monitoring and/or control functions have been implemented into MEMS devices.

One particular type of MEMS sensor is an accelerometer. Typically, a MEMS accelerometer includes, among other component parts, a proof mass that may be constructed on a silicon-on-insulator wafer. The proof mass is resiliently suspended by one or more suspension springs to one section of the wafer. The proof mass moves when the MEMS accelerometer experiences acceleration, and the movement is converted into an electrical signal having a parameter magnitude (e.g., voltage, current, frequency, etc.) that is proportional to the acceleration.

MEMS accelerometers are typically implemented into systems having many electronic devices. Each device may emit electromagnetic interference waves, and, if the MEMS accelerometer is placed too close to another device, it may experience parasitic capacitance from the device during operation. To minimize this phenomenon, a cap is typically used to enclose the proof mass of the MEMS accelerometer, and the cap is grounded to the wafer of the MEMS accelerometer via bond wires.

MEMS accelerometers are increasingly becoming smaller, thus, bond wires having fine and ultra-fine pitches and decreased diameters are typically used; however, these bond wires may have certain drawbacks. For example, the decreased pitch and diameter may cause difficulties in handling and bonding the bond wires. In particular, the bond wires may unintentionally short to other conductive structures of the MEMS accelerometer. Additionally, attaching bond wires to the components is a relatively expensive process.

Accordingly, it is desirable to provide a process for manufacturing a MEMS accelerometer that is relatively inexpensive and simple to implement and that does not unintentionally short to other conductive structures. In addition, it is desirable for the process not to employ additional manufacturing equipment. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

FIG. 3 is a flow diagram depicting an exemplary method for manufacturing the exemplary MEMS sensor illustrated in. FIG. 1;

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. In this regard, although the invention is depicted and described in the context of an accelerometer, it will be appreciated that the invention at least could be used for any one of numerous devices that include a proof mass movably suspended above a substrate surface or any microelectromechanical systems ("MEMS") device that may need protection from electromagnetic interference.

Figure 1:
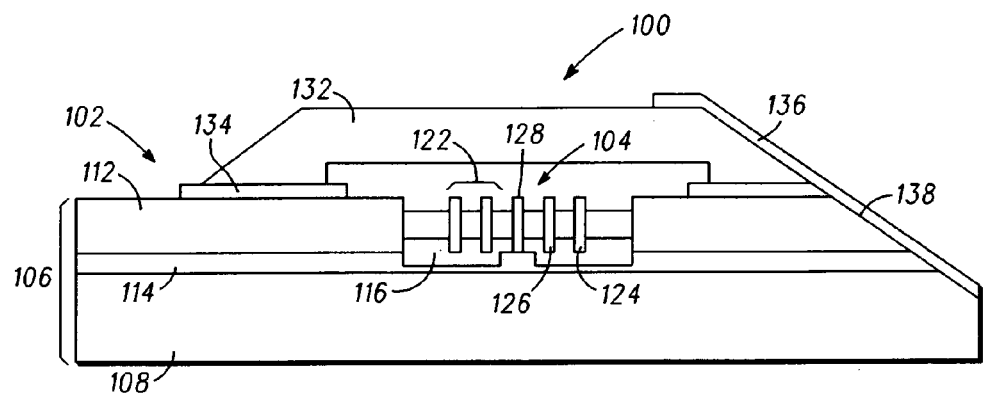
FIG. 1 is a cross-sectional view of an exemplary MEMS sensor.

Turning now to the description, FIG. 1 is a cross-sectional view of an exemplary MEMS device 100. MEMS device 100 is an inertial sensor, such as an accelerometer, and includes a field region 102 and a sensor region 104 formed on a wafer 106. Wafer 106 may be any one of numerous types of conventionally-used wafers. For example, and as depicted in FIG. 1, wafer 106 may be an SOI ("silicon-on-insulator") wafer. In such case, wafer 106 generally includes a handle layer 108, an active layer 112, and a sacrificial layer 114 disposed between handle layer 108 and active layer 112. Field region 102 and sensor region 104 are both formed in active layer 112. Field region 102 is a region of active layer 112 that remains affixed to handle layer 108, via sacrificial layer 114. Conversely, sensor region 104, while being coupled to field region 102, is also partially released from handle layer 108. In particular, sensor region 104 is partially undercut by removing portions of sacrificial layer 114 below sensor region 104. This undercut forms a release trench 116 that releases portions of sensor region 104 from handle layer 108. The released portions of sensor region 104 are thus suspended above wafer 106.

Sensor region 104 includes a plurality of sensor elements, which may vary depending, for example, on the particular MEMS device 100 being implemented. However, in the depicted embodiment, in which MEMS device 100 is an accelerometer, the sensor elements include a suspension spring 122, a structure 124, which in this case is a seismic mass, a moving electrode 126, and a fixed electrode 128. Suspension spring 122 resiliently suspends seismic mass 124 and moving electrode 126 above handle layer 108 and is preferably configured to be relatively flexible. Suspension spring 122, seismic mass 124, and moving electrode 126 each overlie release trench 116 and are thus, all released from and suspended above wafer 106. Fixed electrode 128, however, remains affixed to wafer 106 via, for example, sacrificial layer 114.

For clarity and ease of illustration, it will be appreciated that the sensor region 104 is depicted in FIG. 1 to include only a single suspension spring 122, a single moving electrode 126, and a single fixed electrode 128. However, in a particular physical implementation, which is shown more clearly in FIG. 2, and which will now be described in more detail, the sensor region 104 includes a pair of suspension springs 122, a plurality of moving electrodes 126, and a plurality of fixed electrodes 128. Suspension springs 122 are each coupled between field region 102 and seismic mass 124 and, as was previously noted, resiliently suspend seismic mass 124, when released, above wafer 106. Moving electrodes 126 are each coupled to seismic mass 124, and thus are also, when released, suspended above wafer 106. As FIG. 2 also shows, moving electrodes 126 are each disposed between two fixed electrodes 128. Fixed electrodes 128, as was noted above, are not released. Rather, fixed electrodes 128 remain anchored to wafer 106, via a plurality of anchors 202.

Turning back to FIG. 1, to reduce the presence of parasitic capacitance during the operation of MEMS device 100, a protective cap 132 and an interconnect 136 are included. Protective cap 132 is coupled to wafer 106, and extends over at least sensor region 104 to provide physical protection thereof. Preferably, protective cap 132 is partially spaced-apart from sensor region 104 to allow at least a portion of sensor region 104 to move. Protective cap 132 and wafer 106 may be coupled to each other in any one of numerous manners. For example, in the depicted embodiment, protective cap 132 is coupled to field region 102 via a cap anchor 134. Cap anchor 134 may be any one of numerous suitable devices for sealingly coupling protective cap 132 to wafer 106, such as, for example, a frit seal. Alternatively, protective cap 132 may be coupled to one or more non-movable portions of sensor region 104, such as one or more fixed electrodes 128.

Figure 2:
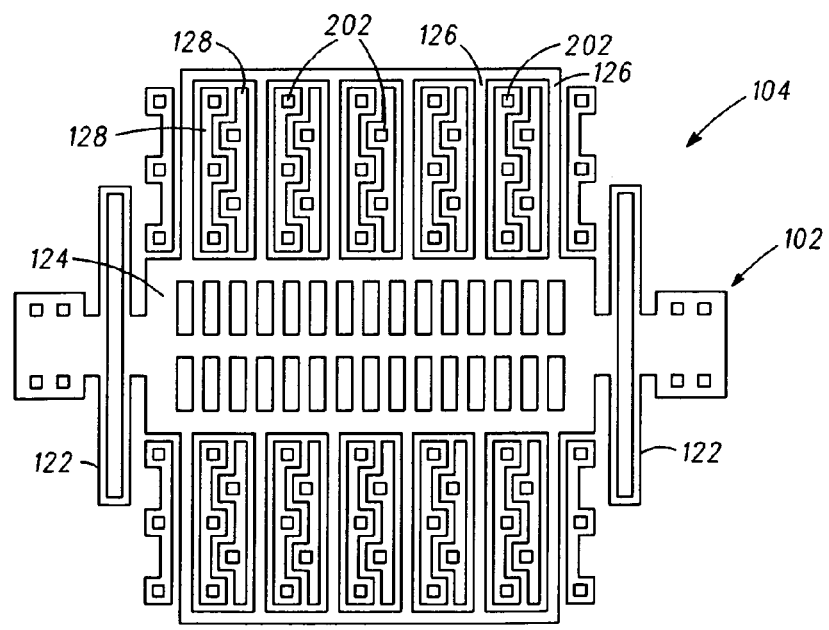
FIG. 2 is a top view of the exemplary MEMS sensor depicted in FIG. 1.

MEMS device 100 illustrated in FIGS. 1 and 2 are implemented as capacitance type accelerometers. Thus, when MEMS device 100 experiences an acceleration, seismic mass 124 will move a distance that is proportional to the magnitude of the acceleration being experienced. Moving electrode 126 is connected to seismic mass 124, and thus move the same distance as seismic mass 124. Moving electrode 126 and fixed electrode 128 together form a variable differential capacitor. Thus, when MEMS device 100 experiences an acceleration, moving electrode 126 may move toward or away from fixed electrode 128. The distance that the moving electrode 126 moves will result in a proportional change in capacitance between fixed electrode 126 and moving electrode 128. This change in capacitance may be measured and used to determine the magnitude of the acceleration.

Interconnect 136 grounds protective cap 132 to handle layer 108 to prevent parasitic capacitance from interfering with the above-mentioned capacitance measurement. Preferably, interconnect 136 is coupled to a sidewall 138 that is defined by edges of active layer 112, sacrificial layer 114, protective cap 132, and cap anchor 134. Interconnect 136 is adhered to sidewall 138 such that at least protective cap 132 and handle layer 108 are electrically coupled. Alternatively, interconnect 136 may extend beyond sidewall 138 and may cover other portions of protective cap 132, such as a top portion.

Interconnect 136 may be made of any one of a number of conductive materials. For example, interconnect 136 may comprise a metal, and may be a single layer of metal, such as aluminum, or may be a double layer of metal, such as, titanium or chromium and aluminum. It will be appreciated that other suitable metals may be employed as well. In another example, interconnect 136 is a conductive epoxy.

Figure 3:
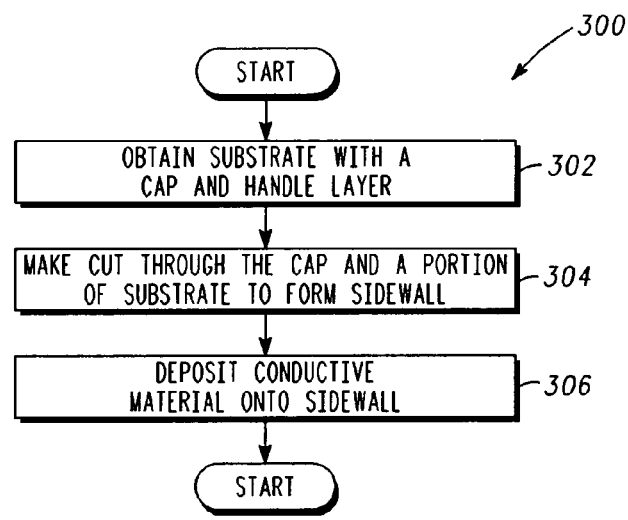

Turning to FIG. 3, a flow diagram of an exemplary method 300 for manufacturing MEMS device 100 is depicted. First, a substrate having at least a protective cap over a handle layer is obtained (step 302). Then, a cut is made through the protective cap and at least a portion of the substrate to form a sidewall (step 304). Next, a conductive material is deposited onto the sidewall (step 306).

Figure 4:
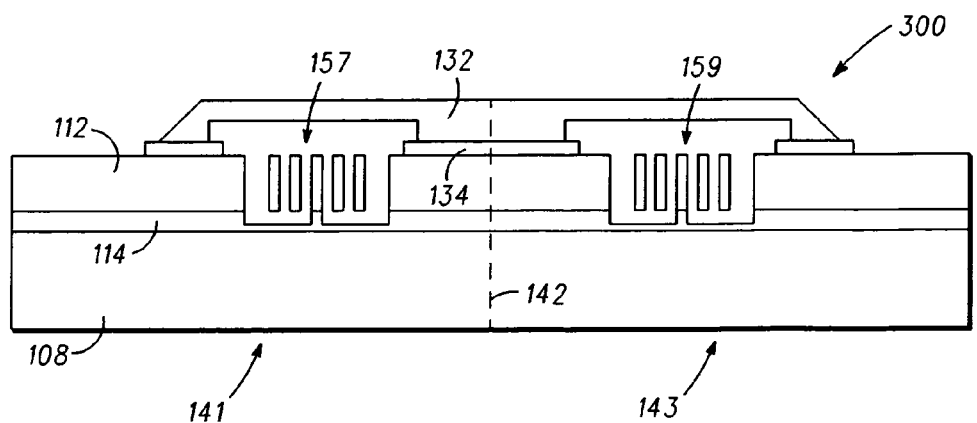
FIG. 4 is a cross-sectional view of an exemplary substrate that may be used in the method depicted in FIG. 3.
Figure 5:
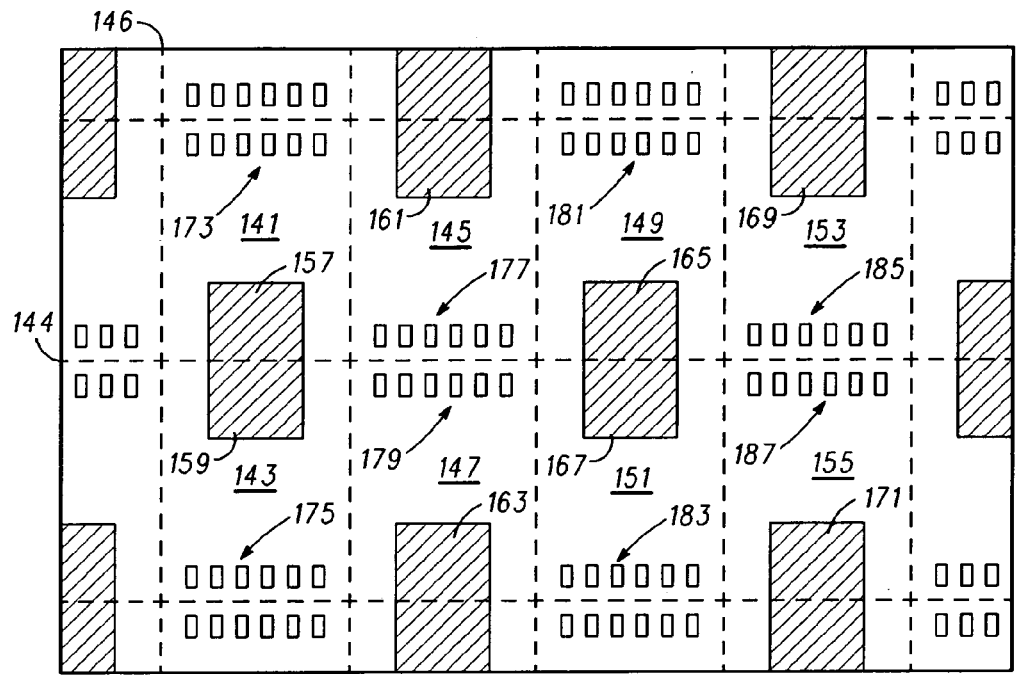
FIG. 5 is a top view of the exemplary substrate shown in FIG. 4.

Step 302 may be performed using any one of numerous conventional techniques. For example, a suitable substrate may be obtained off-the-shelf, or alternatively, may be manufactured. FIG. 4 illustrates a cross section view of an exemplary suitable substrate 300. Substrate 300 includes handle layer 108, sacrificial layer 114 disposed over handle layer 108, active layer 112 disposed over sacrificial layer 114, sensor regions 157 and 159 formed in active layer 112, and protective cap 132. Cap anchor 134 is disposed between protective cap 132 and active layer 112. Substrate 300 also includes a first die section 141 and a second die section 143 defined by a dotted line 142 that each includes one of sensor regions 157 and 159. Although two die sections 141 and 143 are illustrated in FIG. 4, it will be appreciated that more are typically formed in a substrate. For example, as shown in a top view of substrate 300 provided in FIG. 5, substrate 300 may include a plurality of die sections 141, 143, 145, 147, 149, 151, 153, and 155 which include a plurality of sensor regions 157, 159, 161, 163, 165, 167, 169, and 171 and bond pads 173, 175, 177, 179, 181, 183, 185, and 187 formed thereon. Each die section 141, 143, 145, 147, 149, 151, 153, and 155 is defined in FIG. 5 by perpendicular intersecting dotted lines, e.g. lines 144 and 146. Although each die section 141, 143, 145, 147, 149, 151, 153, and 155 is shown as being rectangular, it will be appreciated that the die sections may have any other suitable shape, such as, for example, circular, ovular, pentagonal, hexagonal, septagonal, or the like.

Next, a cut is made between die sections 141, 143, 145, 147, 149, 151, 153, and 155 at least through protective cap 132 and handle layer 108 (step 304). For example, the cut may be made along at least one of the dotted lines shown in FIG. 5, such as, for example, along a first dotted line 144 or along a second dotted line 146. Alternatively, if die sections 141, 143, 145, 147, 149, 151, 153, and 155 have shapes other than rectangular, the cut may be made in any non-active section of die sections 141, 143, 145, 147, 149, 151, 153, and 155. The cut may be any type of cut, including, but not limited to a straight cut or a bevel cut. In an embodiment in which a straight cut is used, substantially vertical cuts and a horizontal cut between the vertical cuts are made to form a U-shaped trough. In an embodiment in which bevel cuts are used, a single bevel cut may be made using a V-shaped blade. The blade may have a 60 degree bevel. In another exemplary embodiment, multiple bevel cuts are made. For example, a first bevel cut is first made, then a second bevel cut is made at an angle relative to the first bevel cut to form a V-shaped trough. The angle between the first and second bevel cuts is preferably about 60 degrees, however, any other suitable angle may alternatively be used.

Figure 6:
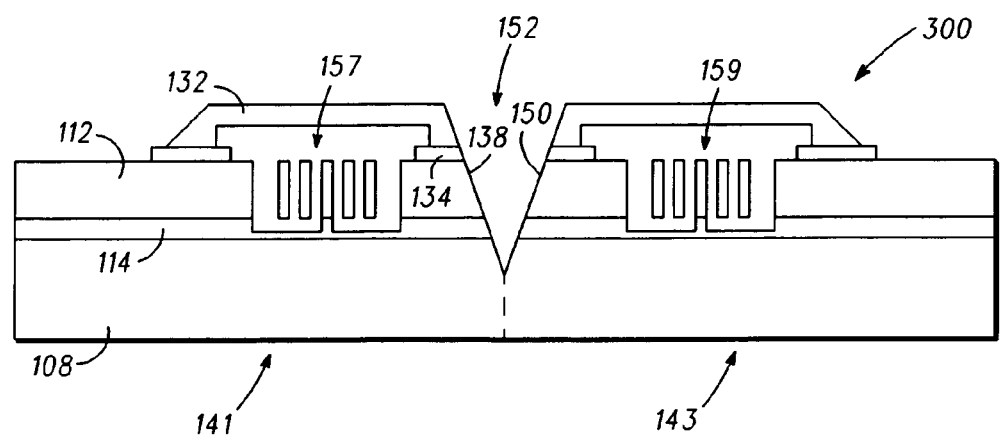
FIG. 6 is a cross-sectional view of the exemplary substrate of FIG. 4 during another step of the exemplary method depicted in FIG. 3.

FIG. 6 shows one exemplary embodiment of substrate 300 including a bevel cut made by a V-shaped blade between a first die section 141 and a second die section 143. In this embodiment, the bevel cut extends through protective cap 132, cap anchor 134, active layer 112, sacrificial layer 114, and handle layer 108. As depicted in FIG. 6, only a portion of handle layer 108 is cut so that first die section 141 and second die section 143 remain joined to each other. Each of protective cap 132, cap anchor 134, active layer 112, sacrificial layer 114, and handle layer 108 has exposed edges that together define a first sidewall 138 and a second sidewall 150. First and second sidewalls 138 and 150 form a trough 152.

Next, a conductive material is deposited onto one or both of sidewalls 138 and 150 (step 306). The conductive material may be deposited in any conventional manner, such as, for example, by sputtering, vacuum deposition, or any other type of deposition process. In one exemplary embodiment, an appropriately patterned mask is placed over substrate 300 to protect at least a portion of the surface of active layer 112 and protective cap 132 while also exposing trough 152. The conductive material is deposited into trough 152 and onto first and second sidewalls 138 and 150 until each is coated with the conductive material. Alternatively, the conductive material is deposited into and fills trough 152. In such case, a conductive epoxy material is preferably used, and a subsequent curing process may be included.

Once handle layer 108 and protective cap 132 are electrically coupled to one another by the conductive material, die sections 141 and 143 may be singulated from one another. Singulation may occur in any conventional manner, such as by sawing, and may be achieved using any type of cut, for example, a straight cut. In any event, substrate 300 is cut to separate die sections 141 and 143 from each other and preferably, the cut is made through a section of trough 152. For example, the cut may be placed between first sidewall 138 and second sidewall 150.

Methods have now been provided for forming a micro-electromechanical systems ("MEMS") device from a substrate comprising a handle layer and a cap overlying the handle layer. In one exemplary embodiment, the method includes the steps of making a first cut through the cap and at least a portion of the substrate to form a first sidewall and depositing a conductive material onto the first sidewall to electrically couple the cap to the substrate. The method may also include making a second cut at an angle relative to the first sidewall through the cap and another portion of the substrate to form a second sidewall and a trench between the first sidewall and second sidewall. The step of making the second cut may comprise forming the second sidewall adjacent the first sidewall. Alternatively, the step of making the second cut comprises forming an angle of less than about 60 degrees between the first sidewall and the second sidewall. In another embodiment, the step of depositing the conductive material comprises filling the trench with the conductive material. In another exemplary embodiment, the substrate has a first die area and a second die area, and the method further comprises sawing through the conductive material and substrate to singulate the first die area from the second die area.

In still another embodiment, the step of making the first cut comprises using a bevel-shaped blade to make a single bevel cut through the cap and a portion of the substrate. Alternatively, the step of making the first cut comprises making the first cut through the cap and at least a portion of the handle layer. In another embodiment, the step of depositing the conductive material comprises placing a mask over the substrate that covers a portion of the cap and exposes the first sidewall. Alternatively, the step of depositing the conductive material comprises sputtering a layer of the conductive material over the first sidewall. In another embodiment, the substrate has a first die area and a second die area, and the step of making the first cut comprises making the cut between the first die area and the second die area. In still another embodiment, wherein the substrate has a first die area and a second die area, the method further comprises cutting through the conductive material and substrate to singulate the first die area from the second die area.

In another exemplary embodiment of the method, the method includes the steps of making a first cut through the cap, the cap anchor, the active layer, the sacrificial layer, and a portion of the handle layer, placing a second cut through the cap, the cap anchor, the active layer, the sacrificial layer, and a portion of the handle layer, the second bevel cut angled relative to the first bevel cut to form a trench, and depositing a conductive material into the trench that contacts the cap, the cap anchor and the handle layer. In one embodiment, the step of placing the second cut comprises placing the second bevel cut adjacent the first sidewall to form a V-shaped trench. In still another embodiment, the step of placing the second cut comprises forming an angle of less than about 60 degrees between the first cut and the second cut. In still yet another embodiment, the step of depositing the conductive material comprises filling the trench with a conductive epoxy. In still yet another embodiment, the step of making the first cut comprises using a bevel-shaped blade to make a single bevel cut through the cap and a portion of the substrate. Alternatively, the substrate has a first die area and a second die area, and the method further comprises sawing through the conductive epoxy and handle layer to singulate the first die area from the second die area.

A MEMS device is also provided that includes a handle layer having a sidewall, a cap overlying said handle layer, said cap having a sidewall, and a conductive material disposed on at least a portion of said sidewall of said cap and said sidewall of said handle layer to thereby electrically couple said handle layer to said cap. In one embodiment, the conductive material comprises at least one material selected from the group consisting of a conductive epoxy and a metal.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method of forming a micro-electromechanical systems ("MEMS") device comprising:
providing a substrate comprising a handle layer, a cap overlying the handle layer, and at least one MEMS device element;
making a first cut through the cap and at least a portion of the handle layer to form a first sidewall; and
depositing a conductive material onto the first sidewall to electrically couple the cap to the handle layer.

2. The method of claim 1, further comprising making a second cut at an angle relative to the first sidewall through the cap and another portion of the substrate to form a second sidewall and a trench between the first sidewall and second sidewall.

3. The method of claim 2, wherein the step of making the second cut comprises forming the second sidewall adjacent the first sidewall.

4. The method of claim 3, wherein the step of making the second cut comprises forming an angle of less than about 60 degrees between the first sidewall and the second sidewall.

5. The method of claim 2, wherein the step of depositing the conductive material comprises filling the trench with the conductive material.

6. The method of claim 5, wherein the substrate has a first die area and a second die area, and the method further comprises sawing through the conductive material and substrate to singulate the first die area from the second die area.

7. The method of claim 1, wherein the step of making the first cut comprises using a bevel-shaped blade to make a single bevel cut through the cap and a portion of the substrate.

8. The method of claim 1, wherein the step of making the first cut comprises making the first cut through the cap and at least a portion of the handle layer.

9. The method of claim 1, wherein the step of depositing the conductive material comprises: placing a mask over the substrate that covers a portion of the cap and exposes the first sidewall.

10. The method of claim 1, wherein the step of depositing the conductive material comprises:
sputtering a layer of the conductive material over the first sidewall.

11. The method of claim 1, wherein the substrate has a first die area and a second die area, and the step of making the first cut comprises making the cut between the first die area and the second die area.

12. The method of claim 1, wherein the substrate has a first die area and a second die area, and the method farther comprises cutting through the conductive material and substrate to singulate the first die area from the second die area.

13. A method of forming a MEMS device comprising:
providing a substrate comprising a handle layer, a sacrificial layer disposed over the handle layer, an active layer disposed over the sacrificial layer, a plurality of MEMS device elements formed within the active layer, a cap anchor disposed over the active layer, and a cap disposed over the cap anchor;
making a first cut through the cap, the cap anchor, the active layer, the sacrificial layer, and a portion of the handle layer;
placing a second cut through the cap, the cap anchor, the active layer, the sacrificial layer, and a portion of the handle layer, the second bevel cut angled relative to the first bevel cut to form a trench; and
depositing a conductive material into the trench that contacts the cap, the cap anchor and the handle layer.

14. The method of claim 13, wherein the step of placing the second cut comprises placing the second bevel cut adjacent the first sidewall to form a V-shaped trench.

15. The method of claim 14, wherein the step of placing the second cut comprises forming an angle of less than about 60 degrees between the first cut and the second cut.

16. The method of claim 13, wherein the step of depositing the conductive material comprises filling the trench with a conductive epoxy.

17. The method of claim 13, wherein the step of making the first cut comprises using a bevel-shaped blade to make a single bevel cut through the cap and a portion of the substrate.

18. The method of claim 13, wherein the substrate has a first die area and a second die area, and the method further comprises sawing through the conductive epoxy and handle layer to singulate the first die area from the second die area.

* * * * *

UNITED STATES PATENT AND TRADEMARK OFFICE
CERTIFICATE OF CORRECTION

PATENT NO. : 7,316,965 B2  Page 1 of 1
APPLICATION NO. : 11/158793
DATED : January 8, 2008
INVENTOR(S) : Stephen R. Hooper et al.

It is certified that error appears in the above-identified patent and that said Letters Patent is hereby corrected as shown below:

Column 7, line 34, "farther" should be changed to --further--;

Signed and Sealed this

Sixth Day of May, 2008

JON W. DUDAS
*Director of the United States Patent and Trademark Office*